United States Patent
Yu et al.

(10) Patent No.: US 9,786,693 B2
(45) Date of Patent: Oct. 10, 2017

(54) THIN FILM TRANSISTOR SUBSTRATE

(71) Applicant: InnoLux Corporation, Miao-Li-County (TW)

(72) Inventors: Yi-Ling Yu, Miao-Li-County (TW); Wei-Ching Cho, Miao-Li-County (TW); Hsia-Ching Chu, Miao-Li-County (TW)

(73) Assignee: INNOLUX CORPORATION (TW)

( * ) Notice: Subject to any disclaimer, the term of this patent is extended or adjusted under 35 U.S.C. 154(b) by 68 days.

(21) Appl. No.: 14/789,101

(22) Filed: Jul. 1, 2015

(65) Prior Publication Data

US 2016/0231632 A1    Aug. 11, 2016

(30) Foreign Application Priority Data

Feb. 6, 2015    (TW) ............................. 104104153 A

(51) Int. Cl.
| | | |
|---|---|---|
| *H01L 27/12* | (2006.01) | |
| *G02F 1/136* | (2006.01) | |
| *G02F 1/1362* | (2006.01) | |

(52) U.S. Cl.
CPC ............ *H01L 27/124* (2013.01); *G02F 1/136* (2013.01); *G02F 1/136227* (2013.01); *G02F 2001/13606* (2013.01)

(58) Field of Classification Search
CPC ........................................................ G02F 1/136
See application file for complete search history.

(56) References Cited

U.S. PATENT DOCUMENTS

| | | | | |
|---|---|---|---|---|
| 2011/0007234 A1* | 1/2011 | Liu | ...................... | H01L 27/1214 349/43 |
| 2012/0327321 A1* | 12/2012 | Huang | .................. | G02F 1/1362 349/42 |
| 2015/0137117 A1* | 5/2015 | Tsai | ...................... | H01L 27/124 257/43 |

* cited by examiner

*Primary Examiner* — Shaun Campbell
*Assistant Examiner* — Aneta Cieslewicz
(74) *Attorney, Agent, or Firm* — Bacon & Thomas, PLLC

(57) ABSTRACT

A display panel is disclosed, which comprises: a first substrate; a scan line disposing on the first substrate; a data line disposing on the first substrate and overlapping with the scan line to form a first overlapping region; and an active layer disposing between the scan line and the data line and overlapping with the scan line and the data line to form a second overlapping region, wherein the second overlapping region locates in the first overlapping region and has a via, wherein an edge of the scan line has a first length along a substantial extension direction of the scan line in the first overlapping region, the active layer has a second length along a substantial extension direction of the scan line in the second overlapping region, and the second length is greater than the first length.

15 Claims, 5 Drawing Sheets

THIN FILM TRANSISTOR SUBSTRATE

CROSS REFERENCE TO RELATED APPLICATION

This application claims the benefits of the Taiwan Patent Application Serial Number 104104153, filed on Feb. 6, 2015, the subject matter of which is incorporated herein by reference.

BACKGROUND OF THE INVENTION

1. Field of the Invention

The present invention relates to a display panel and, more particularly, to a display panel with source electrodes having specific areas, sizes and shapes to reduce parasitic capacitance therein.

2. Description of Related Art

In recent years, the display devices having small volume, thin thickness and light weight are developed as the display techniques progresses, and a conventional cathode ray tube (CRT) display is gradually replaced by the LCD device. Especially, the LCD device can be applied to various fields. For example, the daily used devices such as cell phones, notebooks, video cameras, cameras, music players, navigation devices, and televisions are equipped with liquid crystal display (LCD) panels.

For the conventional LCD device, a liquid crystal layer is disposed between two electrodes, and voltage is applied onto the electrodes to control the tilt of liquid crystal molecules. Thus, it is possible to control light from a backlight module disposed below the LCD panel to pass or not pass through the liquid crystal layer, and the purpose of displaying can be achieved.

Even though the techniques of the LCD device are getting matured, many manufacturers are desired to develop LCD panels having improved display quality thereof to meet the consumers' requirements. Hence, it is desirable to provide a display panel with improved display quality to satisfy the requirement for high display quality.

SUMMARY OF THE INVENTION

The present invention provides a display panel, wherein the source electrodes comprised therein have specific areas, sizes and shapes to reduce parasitic capacitance in the overlapping region of data lines and scan lines.

The display panel of the present invention comprises: a first substrate; a scan line disposing on the first substrate; a data line disposing on the first substrate and overlapping with the scan line to form a first overlapping region; and an active layer disposing between the scan line and the data line and overlapping with the scan line and the data line to form a second overlapping region, wherein the second overlapping region locates in the first overlapping region and has a via electrically connecting the data line and the active layer, wherein an edge of the scan line has a first length along a substantial extension direction of the scan line in the first overlapping region, the active layer has a second length along the substantial extension direction of the scan line in the second overlapping region, and the second length is greater than the first length.

In the display panel of the present invention, the first overlapping region comprises a first edge and a first concave, wherein the first edge is the edge of the scan line in the first overlapping region, and an end of the first concave connects to an end of the first edge.

In the display panel of the present invention, the first overlapping region may further comprise a second concave, wherein two ends of the first edge respectively connects to ends of the first concave and the second concave, and curvature radiuses of the first concave and the second concave are different.

The display panel of the present invention may further comprise a drain electrode apart from the data line in a predetermined distance to obtain a channel region. Herein, the first concave is relatively close to the drain electrode comparing with the second concave. In addition, the data line has a first data line edge and a second data line edge opposite to the first data line edge, and the first data line edge is relatively close to the drain electrode comparing with the second data line edge. The first concave has a first point being an intersection point of the scan line and the data line, and there is a first distance between the first point and a first reference line which is a tangent line to an outmost edge of the first data line edge and vertical to the substantial extension direction of the scan line; the second concave has a third point being an intersection point of the scan line and the data line, and there is a second distance between the third point and a second reference line which is a tangent line to an outmost edge of the second data line edge and vertical to the substantial extension direction of the scan line; and the second distance is larger than the first distance.

The display panel of the present invention may further comprise a drain electrode disposed on the scan line and apart from the data line in a predetermined distance to obtain a channel region. Herein, the first overlapping region has a second edge, a first concave and a third concave, wherein the second edge is an edge of the data line in the first overlapping region relatively close to the drain electrode, and two ends of the second edge respectively connects to ends of the first concave and the third concave, and curvature radiuses of the first concave and the third concave are different. Alternatively, the first overlapping region has a fourth edge, a second concave and a fourth concave, the fourth edge is an edge of the data line in the first overlapping region relatively away from the drain electrode; wherein two ends of the fourth edge respectively connects to ends of the second concave and the fourth concave, and curvature radiuses of the second concave and the fourth concave are different.

In the display panel of the present invention, the scan line has a first scan line edge, the data line has a first data line edge, the active layer has a first active layer edge and a second active layer edge opposite to the first active layer edge, and the first active layer edge is relatively close to the first scan line edge comparing with the second active layer edge. Herein, the first scan line edge and the first data line edge intersect at a fifth point, the first active layer edge and the first data line edge intersect at a sixth point, and the second active layer edge and the first data line edge intersect at a second point; wherein one connecting line of the fifth point and the sixth point intersects another connecting line of the second point and the sixth point, and an angle not 180° is included between the said two connecting lines. Alternatively, the scan line further has a second scan line edge, the second scan line edge and the first data line edge intersect at a first point, one connecting line of the second point and the sixth point intersects another connecting line of the first point and the second point, and an angle not 180° is included between the said two connecting lines.

In the display panel of the present invention, the data line may further have a second data line edge opposite to the first data line edge, wherein the second data line edge and the first scan line edge intersect at a seventh point, the second data line edge and the first active layer edge intersect at an eighth point, and an included angle between a connecting line of the fifth point and the sixth point and a substantial extension direction of the data line is smaller than another included angle between another connecting line of the seventh point and the eighth point and the substantial extension direction of the data line.

In the display panel of the present invention, an extension direction of the second edge is substantially identical to that of the data line.

In the display panel of the present invention, the data line has a third length along the substantial extension direction of the scan line outside the first overlapping region, and the second length is larger than the third length.

The display panel of the present invention may further comprise: plural scan lines disposing on the first substrate; plural data lines disposing on the first substrate and respectively intersect with the scan lines; and plural sub-pixel units disposed between two adjacent scan lines and two adjacent data lines, wherein one thin film transistor unit is respectively disposed in each sub-pixel unit, and each thin film transistor unit respectively comprises a source electrode electrically connecting to the data line and a drain electrode disposed on the scan line. Herein, a distance between the source electrode and the drain electrode both in the same sub-pixel unit is smaller than that between the source electrode in one sub-pixel unit and the drain electrode in another sub-pixel unit adjacent thereto.

In the display panel of the present invention, the via may have a non-circular outline.

In the display panel of the present invention, the via may have an ellipse-like outline observing from a direction from the data line to the first substrate, wherein the ellipse-like outline has a long axis and a short axis, and an included angle between the long axis and a substantial extension direction of the data line is in a range from 0° to 10°.

In the display panel of the present invention, the long axis can be parallel to the substantial extension direction of the data line.

In the display panel of the present invention, the areas, the sizes and the shapes of the source electrodes are designed to reduce parasitic capacitance in the overlapping region of the data lines and the scan lines. In addition, the overlapping regions are designed to have at least one concave; therefore, the shapes of the data lines and the pixel electrodes can match well to make the tilt angles of liquid crystal molecules more consistent, further improving the optical performance of the liquid crystal layer. Furthermore, the distance of the channel region is reduced in the display panel of the present invention, and thus the electrical performance of the thin film transistor units can further be improved.

Other objects, advantages, and novel features of the invention will become more apparent from the following detailed description when taken in conjunction with the accompanying drawings.

DETAILED DESCRIPTION OF THE PREFERRED EMBODIMENT

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

Embodiment 1

Figure 1:
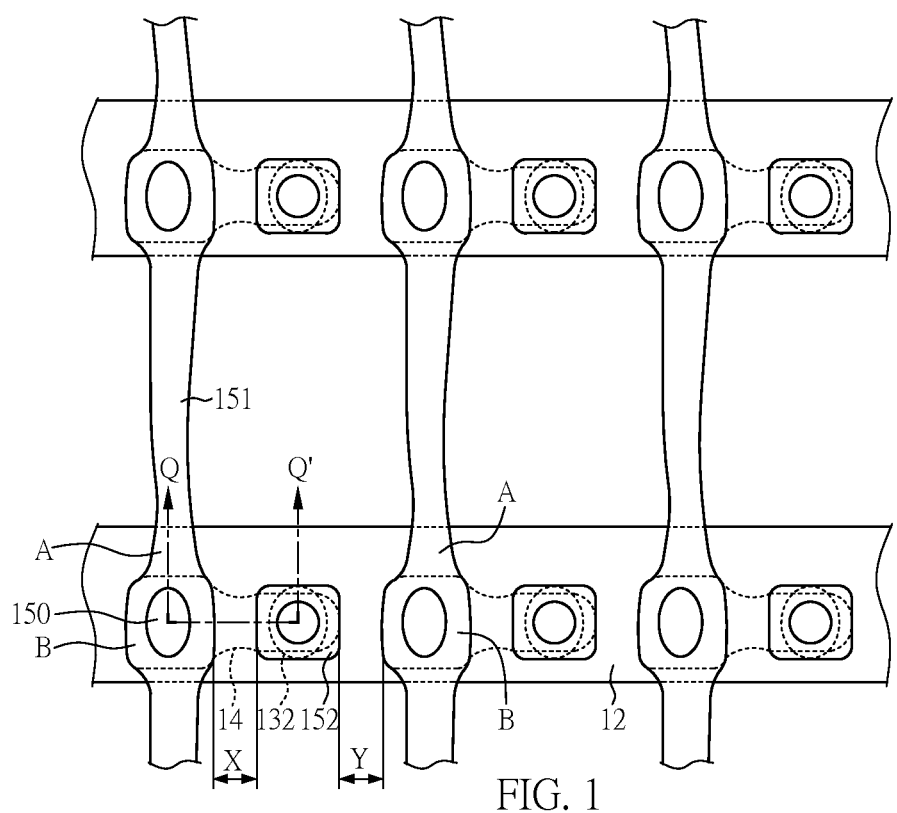
FIG. 1 is a top view of a thin film transistor substrate according to Embodiment 1 of the present invention.
Figure 2:
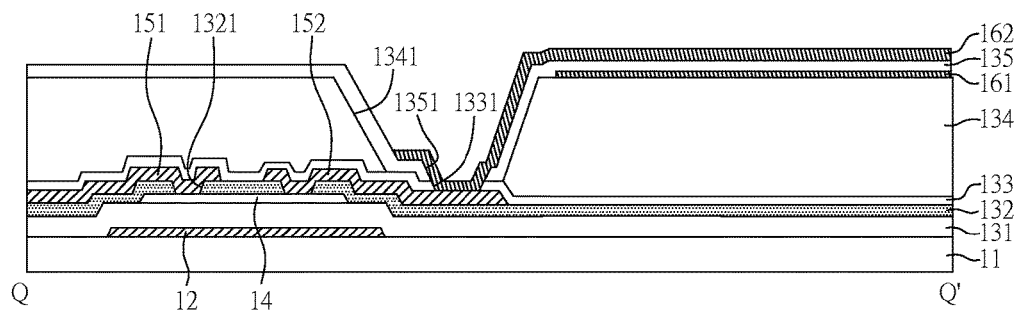
FIG. 2 is a cross-sectional view of a thin film transistor substrate according to Embodiment 1 of the present invention.

FIG. 1 is a top view of a thin film transistor (TFT) substrate of the present embodiment, and FIG. 2 is a cross-sectional view of the thin film transistor substrate according to the line Q-Q' indicated in FIG. 1. As shown in FIGS. 1 and 2, the TFT substrate of the present embodiment comprises: a first substrate 11; a scan line 12 disposing on the first substrate 11; a data line 151 disposing on the first substrate 11 and overlapping with the scan line 12 to form a first overlapping region A; and an active layer 14 disposing between the scan line 12 and the data line 151 and overlapping with the scan line 12 and the data line 151 to form a second overlapping region B, wherein the second overlapping region B located in the first overlapping region A and has a via 150.

In the display panel of the present embodiment, the scan line 12, the data line 151 and the active layer 14 are respectively laminated on the first substrate 11 to form a three dimensional structure. Thus, in the present invention, the term "first/second overlapping region" refers to the pattern observed in a direction from the data line 151 toward the first substrate 11, i.e. the direction from the top to the bottom in FIG. 2. Additionally, in the display panels of the following embodiment and other embodiments of the present invention, the "first/second overlapping region" also refers to the observed patterns defined as above; therefore, the descriptions thereof are not repeated in the following embodiment.

During the process for manufacturing the thin film transistor substrate of the present embodiment, a first metal layer comprising a scan line 12 (herein, as a gate electrode) is first formed on a first substrate 11. Next, a gate insulating layer 131 is formed on the first metal layer and the first substrate 11, and an active layer 14 is formed on the gate insulating layer 131 and corresponds to the scan line 12 as the gate electrode of the first metal layer. Then, an etching barrier layer 132 is formed on the active layer 14, which comprises plural openings 1321 to expose parts of the active layer 14. Finally, a second metal layer comprising a data line 151 (herein, as a source electrode) and a drain electrode 152 is formed on the etching barrier layer 132 and the active layer 14 to obtain the TFT unit of the present embodiment. Herein, the second metal layer is patterned through an etching process to have special structures, and the detail structures thereof will be further described.

Next, a first insulating layer 133 and a planer layer 134 are sequentially formed on the etching barrier layer 132 and the second metal layer, and the first insulating layer 133 and the planer layer 134 has openings 1331, 1341 after an etching process to expose the drain electrode 152. In addition, a common electrode layer 161, a second insulating layer 135 and a pixel electrode layer 162 are further sequentially formed on the planer layer 134, wherein the second insulating layer 135 also has an opening 1351 after an etching process, which corresponds to the openings 1331, 1341, to expose the drain electrode 152. Moreover, the pixel electrode layer 162 further extends to the side wall of the opening 1351 to electrically connect to the drain electrode 152.

In the present embodiment, the first metal layer and the second metal layer can be made of any conductive material used in the art, such as metals, alloys, metal oxides, metal nitrogen oxides, or other electrode materials generally used in the art. Preferably, the first metal layer and the second metal layer are made of metals, but the present invention is not limited thereto. In addition, the first metal layer and the second metal layer of the present embodiment are not limited to single material layers, and can have multi-layered structures formed by laminating several materials. Furthermore, the first substrate 11 can be made of any substrate material used in the art, such as glass, plastic, or other flexible materials. The gate insulating layer 131, the first insulating layer 133, the planer layer 134 and the second insulating layer 135 can be made of any insulating material used in the art. The active layer 14 can be made of any semiconductor material used in the art, such as poly-silicon, amorphous silicon, or indium gallium zinc oxide (IGZO). The pixel electrode layer 162 and the common electrode layer 161 can be made of any transparent conductive electrode material used in the art, such as indium tin oxide (ITO) and indium zinc oxide (IZO).

Figure 3:
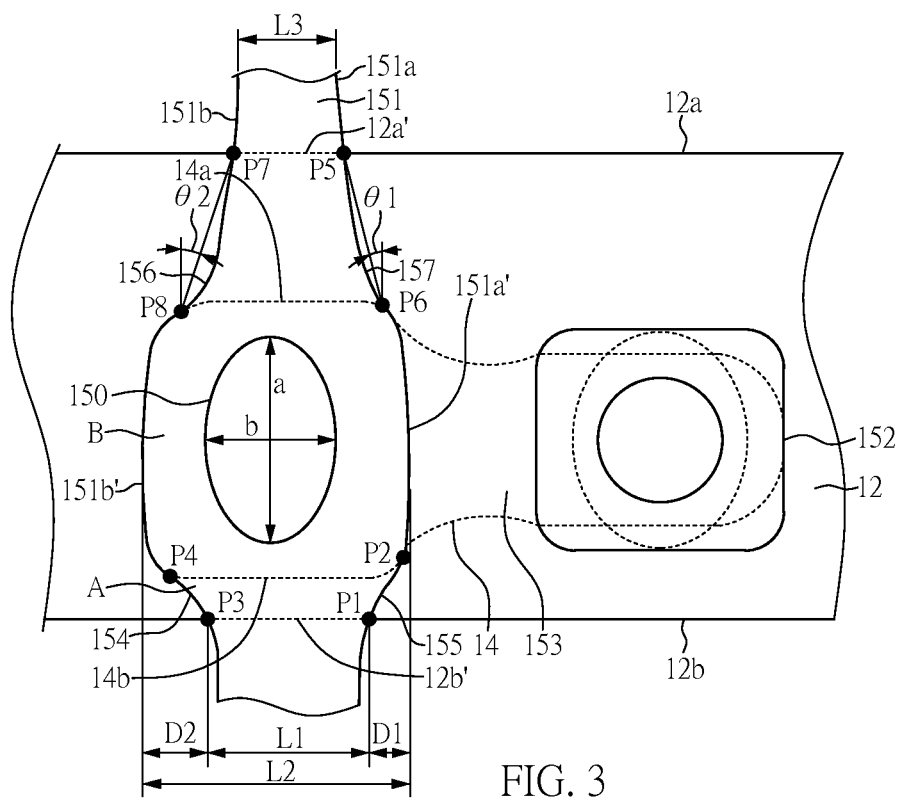
FIG. 3 is a top view of a thin film transistor unit comprised in a thin film transistor substrate according to Embodiment 1 of the present invention.

FIG. 3 is an enlarged view of one TFT unit shown in FIG. 1. As shown in FIG. 3, in the first overlapping region A, an edge of the scan line 12 (which is the second scan line edge 12b in the present embodiment, but may be the first scan line edge 12a in another embodiment) has a first length L1 along a substantial extension direction of the scan line 12. In the second overlapping region B, the active layer 14 has a second length L2 along the substantial extension direction of the scan line 12. Herein, the second length L2 is greater than the first length L1.

In the present embodiment, the first length L1 of the scan line 12 in the first overlapping region A is designed to be smaller than the second length L2 of the active layer 14 along the substantial extension direction of the scan line 12 in the second overlapping region B. Hence, the overlapping region between the data line 151 and the scan line 12 can be decreased, resulting in the parasitic capacitance between the data line 151 and the scan line 12 reduced. Herein, only one edge (the second scan line edge 12b) of the scan line 12 is exemplified. In the present embodiment, the length of another edge (the first scan line edge 12a) thereof along the substantial extension direction of the scan line 12 in the first overlapping region A and the length of the active layer 14 (i.e. the second length L2) along the substantial extension direction of the scan line 12 in the second overlapping region B have the same relation as discussed above.

As shown in FIG. 3, the scan line 12 has a first scan line edge 12a and a second scan line edge 12b opposite to each other, and the data line 151 also has a first data line edge 151a and a second data line edge 151b opposite to each other. The first overlapping region A is the region comprising and surrounded by a first edge 12b', a second edge 151a', a third edge 12a' and a fourth edge 151b'. Herein, the first edge 12b' is one edge of the scan line 12 in the first overlapping region A (i.e. partial second scan line edge 12b under the data line 151, in the present embodiment), the second edge 151a' is the first data line edge 151a of the data line 151 in the first overlapping region A, the third edge 12a' is another edge of the scan line 12 in the first overlapping region A (i.e. partial first scan line edge 12a under the data line 151, in the present embodiment), and the fourth edge 151b' is the second data line edge 151b of the data line 151 in the first overlapping region A.

The second overlapping region B is the region comprising and surrounded by a first active layer edge 14a, a second edge 151a', a fourth edge 151b' and a second active layer edge 14b. Herein, the first active layer edge 14a and the second active layer edge 14b are edges of the active layer 14 in the first overlapping region A. Since the second overlapping region B locates in the first overlapping region A, the first active layer edge 14a in the second overlapping region B is the edge of the active layer 14 close to and substantially parallel to the third edge 12a', and the second active layer edge 14b therein is the edge of the active layer 14 close to and substantially parallel to the first edge 12b'.

In addition, the first overlapping region A further comprise a first concave 155, a second concave 154, a third concave 157 and a fourth concave 156, wherein two ends of the first edge 12b' respectively connects to ends of the first concave 155 and the second concave 154, two ends of the second edge 151a' respectively connects to ends of the first concave 155 and the third concave 157, two ends of the third edge 12a' respectively connects to ends of the third concave 157 and the fourth concave 156, and two ends of the fourth edge 151b' respectively connects to ends of the second concave 154 and the fourth concave 156.

Furthermore, the first concave 155 has a first point P1 and a second point P2, wherein the first point P1 is an intersection point of the scan line 12 and the data line 151, and the second point P2 is an intersection point of the data line 151 and the active layer 14. The second concave 154 has a third point P3 and a fourth point P4, wherein the third point P3 is an intersection point of the scan line 12 and the data line 151, and the fourth point P4 is an intersection point of the data line 151 and the active layer 14. The third concave 157 has a fifth point P5 and a sixth point P6, wherein the fifth point P5 is an intersection point of the scan line 12 and the data line 151, and the sixth point P6 is an intersection point of the data line 151 and the active layer 14. The fourth concave 156 has a seventh point P7 and an eighth point P8, wherein the seventh point P7 is an intersection point of the scan line 12 and the data line 151, and the eighth point P8 is an intersection point of the data line 151 and the active layer 14.

In one preferred embodiment, curvature radiuses of the first concave 155 and the second concave 154 are different. More specifically, as shown in FIG. 3, the drain electrode 152 is apart from the data line 151 in a predetermined distance to obtain a channel region 153, and the first concave 155 is relatively close to the drain electrode 152 comparing with the second concave 154. In addition, the data line 151 has a first data line edge 151a and a second data line edge 151b, and the first data line edge 151a is relatively close to the drain electrode 152 comparing with the second data line edge 151b. Herein, there is a first distance D1 between the first point P1 and a first reference line which is a tangent line to an outmost edge of the first data line edge 151a and vertical to the substantial extension direction of the scan line 12; there is a second distance D2 between the third point P3 and a second reference line which is a tangent line to an outmost edge of the second data line edge 151*b* and vertical to the substantial extension direction of the scan line 12; and the second distance D2 is larger than the first distance D1. Meanwhile, the third concave 157 is relatively close to the drain electrode 152 comparing with the fourth concave 156. The relation between the third concave 157 and the fourth concave 156 is the same as that between the first concave 155 and the second concave 154, and is not repeated herein.

In addition, as shown in FIG. 3, curvature radiuses of the first concave 155 and the third concave 157 are different, and curvature radiuses of the second concave 154 and the fourth concave 156 are also different.

As shown in FIG. 3, the first concave 155, the second concave 154, the third concave 157 and the fourth concave 156 are designed to have specific structures; therefore, the area of the first overlapping region A outside the second overlapping region B is reduced to decrease parasitic capacitance between the scan line 12 and the data line 151. In addition, the first concave 155, the second concave 154, the third concave 157 and the fourth concave 156 are designed to have different curvature radiuses, so the shapes of these concaves can match well with the shapes of the pixel electrode layer (not shown in the figure). Therefore, the tilts of the liquid crystal molecules in these regions can be more consistent to improve the optical performance thereof. Furthermore, the said second distance D2 is designed to be larger than the said first distance D1, so the first overlapping region A and the second overlapping region B can be more close to the channel region 153. Hence, the length of the channel region 153 can be decreased to improve the electric performance of the TFT unit.

In order to keep the length of the channel region 153 consistent, an extension direction of the second edge 151*a*' is substantially identical to that of the data line 151.

Furthermore, as shown in FIG. 3, the active layer 14 has a first active layer edge 14*a* and a second active layer edge 14*b* opposite to the first active layer edge 14*a*, and the first active layer edge 14*a* is relatively close to the first scan line edge 12*a* comparing with the second active layer edge 14*b*. In addition, the first scan line edge 12*a* and the first data line edge 151*a* intersect at a fifth point P5, the first active layer edge 14*a* and the first data line edge 151*a* intersect at a sixth point P6, and the second active layer edge 14*b* and the first data line edge 151*a* intersect at a second point P2. Herein, one connecting line of the fifth point P5 and the sixth point P6 intersects another connecting line of the second point P2 and the sixth point P6, and an angle not 180° is included between the said two connecting lines, i.e. the said two connecting lines are not formed a straight line. Furthermore, the second scan line edge 12*b* and the first data line edge 151*a* intersect at a first point P1, one connecting line of the second point P2 and the sixth point P6 intersects another connecting line of the second point P2 and the first point P1, and an angle not 180° is included between the said two connecting lines, i.e. the said two connecting lines are not formed a straight line. Additionally, the first scan line edge 12*a* and the second data line edge 151*b* intersect at a seventh point P7, the first active layer edge 14*a* and the second data line edge 151*b* intersect at an eighth point P8, and the second active layer edge 14*b* and the second data line edge 151*b* intersect at a fourth point P4, wherein one connecting line of the seventh point P7 and the eighth point P8 intersects another connecting line of the fourth point P4 and the eighth point P8, and an angle not 180° is included between the said two connecting lines, i.e. the said two connecting lines are not formed a straight line. Meanwhile, the second scan line edge 12*b* and the second data line edge 151*b* intersect at a third point P3, and one connecting line of the fourth point P4 and the eighth point P8 intersects another connecting line of the fourth point P4 and the third point P3, and an angle not 180° is included between the said two connecting lines, i.e. the said two connecting lines are not formed a straight line.

In addition, as shown in FIG. 3, an included angle θ1 between a connecting line of the fifth point P5 and the sixth point P6 and a substantial extension direction of the data line 151 is smaller than another included angle θ2 between another connecting line of the seventh point P7 and the eighth point P8 and the substantial extension direction of the data line 151. The similar relation also exists between the connecting line of the fourth point P4 and the third point P3 and another connecting line of the second point P2 and the first point P1, so is not repeated herein.

Furthermore, as shown in FIG. 3, the data line 151 has a third length L3 along the substantial extension direction of the scan line 12 outside the first overlapping region A, and the second length L2 is larger than the third length L3.

As shown in FIG. 1, the TFT substrate of the present embodiment comprises: plural scan lines 12 disposing on the first substrate (not shown in the figure); plural data lines 151 disposing on the first substrate (not shown in the figure) and respectively intersect with the scan lines 12; and plural sub-pixel units disposed between two adjacent scan lines 12 and two adjacent data lines 151, wherein one TFT unit is respectively disposed in each sub-pixel unit, and each TFT unit respectively comprises a source electrode (i.e. the first overlapping region A) electrically connecting to the data line 151 and a drain electrode 152 disposed on the scan line 12. Herein, in two adjacent sub-pixel units, a distance X between the source electrode (i.e. the first overlapping region A) and the drain electrode 152 both in the same sub-pixel unit is smaller than a distance Y between the source electrode (i.e. the first overlapping region A) in one sub-pixel unit and the drain electrode 152 in another sub-pixel unit adjacent thereto. Hence, the channel region can be reduced by making the distance X smaller than the distance Y, to improve the electrical performance of the TFT unit.

In addition, as shown in FIG. 1, a via 150 is disposed in the first overlapping region A and has a non-circular outline. Preferably, the via 150 has an ellipse-like outline observing from a direction from the data line 151 to the first substrate (not shown in the figure). Herein, as shown in FIG. 3, the ellipse-like outline has a long axis a and a short axis b, and an included angle between the long axis a and a substantial extension direction of the data line 151 is in a range from 0° to 10°; and preferably, the long axis a is parallel to the substantial extension direction of the data line 151. Thus, the contacting area of the via 150 can be increased.

Figure 4:
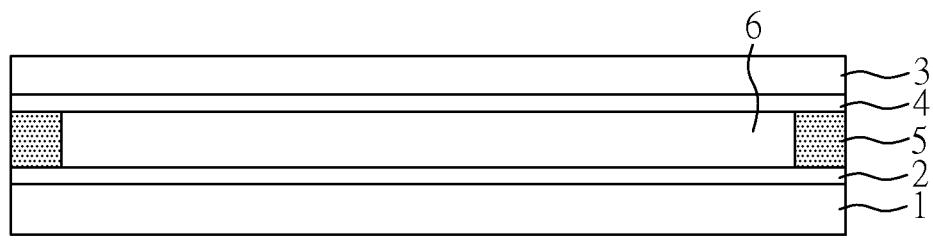
FIG. 4 is a cross-sectional view of a display panel according to Embodiment 1 of the present invention.

The aforementioned TFT substrate of the present embodiment can be applied to a display panel. As shown in FIG. 4, the display panel of the present embodiment comprises: a TFT substrate 1 with a first alignment layer 2 disposed thereon; a counter substrate 3 opposite to the TFT substrate 1 and with a second alignment layer 4 formed thereon, wherein the second alignment layer 4 faces to the first alignment layer 2; a frame sealant 5 disposed between the TFT substrate 1 and the counter substrate 3 and disposing on peripheries of the TFT substrate 1 and the counter substrate 3; and a liquid crystal layer 6 disposed in the space formed by the TFT substrate 1 and the counter substrate 3. As shown in FIGS. 2 and 4, TFT units are disposed on the first substrate 11, and a color filter layer (not shown in the figure) is disposed on the counter substrate 3; therefore, the counter substrate 3 is a color filter substrate. However, in other embodiment of the present invention, the color filter layer (not shown in the figure) can be disposed on the first substrate 11 of FIG. 1. In this case, the first substrate 11 is a color filter on array (COA) substrate.

Figure 5:
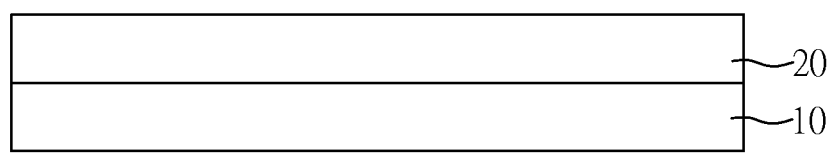
FIG. 5 is a cross-sectional view of a display device according to Embodiment 1 of the present invention.

The aforementioned display panel of the present invention can be applied to a display device. As shown in FIG. 5, the display device of the present embodiment comprises: the aforementioned display panel 10; and a backlight module 20 disposed below the display panel 10 to provide light penetrating through the display panel 10.

Embodiment 2

Figure 6:
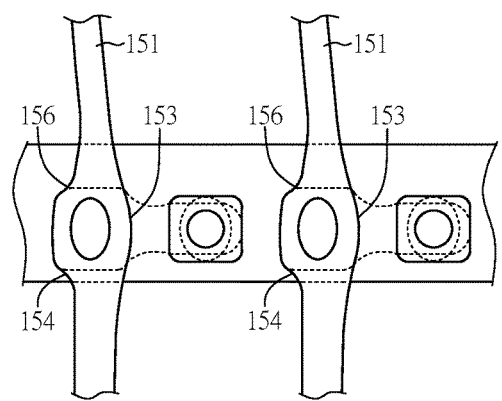
FIG. 6 is a top view of a thin film transistor substrate according to Embodiment 2 of the present invention.

As shown in FIG. 6, the TFT substrate, the display panel and the display device of the present embodiment are the same as those illustrated in Embodiment 1, except that only the fourth concave 156 and the second concave 154 are disposed in the overlapping region, and the first concave and the third concave are not disposed therein.

Embodiment 3

Figure 7:
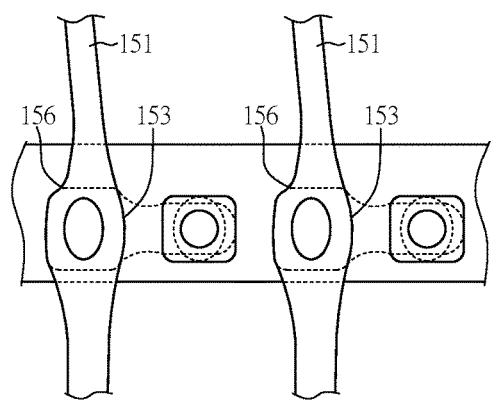
FIG. 7 is a top view of a thin film transistor substrate according to Embodiment 3 of the present invention.

As shown in FIG. 7, the TFT substrate, the display panel and the display device of the present embodiment are the same as those illustrated in Embodiment 1, except that only the fourth concave 156 is disposed in the overlapping region, and the first concave, the second concave and the third concave are not disposed therein.

The display device provided by the aforementioned embodiments of the present invention can be applied to any electronic device for displaying images, such as a mobile phone, a notebook, a camera, a video camera, a music player, a navigation system, or a television.

Although the present invention has been explained in relation to its preferred embodiment, it is to be understood that many other possible modifications and variations can be made without departing from the spirit and scope of the invention as hereinafter claimed.

What is claimed is:

1. A display panel, comprising:
   a first substrate;
   a scan line disposed on the first substrate;
   a data line disposed on the first substrate and overlapping with the scan line to form a first overlapping region; and
   an active layer disposed between the scan line and the data line and overlapping with the scan line and the data line to form a second overlapping region, wherein the second overlapping region locates in the first overlapping region and has a via for electrically connecting the data line and the active layer,
   wherein an edge of the scan line has a first length along an extension direction of the scan line in the first overlapping region, the active layer has a second length along the extension direction of the scan line in the second overlapping region, and the second length is greater than the first length,
   wherein the first overlapping region comprises a first edge and a first concave, the first edge is the edge of the scan line in the first overlapping region, and an end of the first concave connects to an end of the first edge, and at least one part of the first concave is curved shape.

2. The display panel as claimed in claim 1, wherein the first overlapping region further comprises a second concave, two ends of the first edge respectively connects to ends of the first concave and the second concave, and curvature radiuses of the first concave and the second concave are different.

3. The display panel as claimed in claim 2, further comprising a drain electrode apart from the data line in a predetermined distance to obtain a channel region, wherein the first concave is closer to the drain electrode when compared to the second concave, the data line has a first data line edge and a second data line edge opposite to the first data line edge, and the first data line edge is closer to the drain electrode when compared to the second data line edge,
   wherein the first concave has a first point being an intersection point of the scan line and the data line, and there is a first distance between the first point and a first reference line which is a straight line perpendicular to the extension direction of the scan line, and a part of the first reference line fits to a part of the first data line edge but does not overlap the data line; the second concave has a third point being an intersection point of the scan line and the data line, and there is a second distance between the third point and a second reference line which is a straight line perpendicular to the extension direction of the scan line, and a part of the second reference line fits to a part of the second data line edge but does not overlap the data line; and the second distance is larger than the first distance.

4. The display panel as claimed in claim 1, further comprising a drain electrode disposed on the scan line and apart from the data line in a predetermined distance to obtain a channel region, wherein the first overlapping region has a second edge, a first concave and a third concave, the second edge is an edge of the data line in the first overlapping region closer to the drain electrode; wherein two ends of the second edge respectively connect to ends of the first concave and the third concave, and curvature radiuses of the first concave and the third concave are different.

5. The display panel as claimed in claim 1, further comprising a drain electrode disposed on the scan line and apart from the data line in a predetermined distance to obtain a channel region, wherein the first overlapping region has a fourth edge, a second concave and a fourth concave, the fourth edge is an edge of the data line in the first overlapping region away from the drain electrode; wherein two ends of the fourth edge respectively connects to ends of the second concave and the fourth concave, and curvature radiuses of the second concave and the fourth concave are different.

6. The display panel as claimed in claim 1, wherein the scan line has a first scan line edge, the data line has a first data line edge, the active layer has a first active layer edge and a second active layer edge opposite to the first active layer edge, and the first active layer edge is closer to the first scan line edge when compared to the second active layer edge,
   wherein the first scan line edge and the first data line edge intersect at a fifth point, the first active layer edge and the first data line edge intersect at a sixth point, and the second active layer edge and the first data line edge intersect at a second point; and
   one connecting line of the fifth point and the sixth point intersects another connecting line of the second point and the sixth point, and an angle not 180° is included between the said two connecting lines.

7. The display panel as claimed in claim 6, wherein the scan line further has a second scan line edge, the second scan line edge and the first data line edge intersect at a first point, one connecting line of the second point and the sixth point intersects another connecting line of the first point and the second point, and an angle not 180° is included between the said two connecting lines.

8. The display panel as claimed in claim 6, wherein the data line further has a second data line edge opposite to the first data line edge, the second data line edge and the first scan line edge intersect at a seventh point, the second data line edge and the first active layer edge intersect at an eighth point, and an included angle between a connecting line of the fifth point and the sixth point and an extension direction of the data line is smaller than another included angle between another connecting line of the seventh point and the eighth point and the extension direction of the data line.

9. The display panel as claimed in claim 4, wherein an extension direction of the second edge is substantially identical to that of the data line.

10. The display panel as claimed in claim 1, wherein the data line has a third length along the extension direction of the scan line outside the first overlapping region, and the second length is larger than the third length.

11. The display panel as claimed in claim 1, further comprising:
   plural scan lines disposed on the first substrate;
   plural data lines disposed on the first substrate and respectively intersecting with the scan lines; and
   plural sub-pixel units disposed between two adjacent scan lines and two adjacent data lines, wherein one thin film transistor unit is respectively disposed in each sub-pixel unit, and each thin film transistor unit respectively comprises a source electrode electrically connecting to the data line and a drain electrode disposed on the scan line,
   wherein a distance between the source electrode and the drain electrode both in the same sub-pixel unit is smaller than that between the source electrode in one sub-pixel unit and the drain electrode in another sub-pixel unit adjacent thereto.

12. The display panel as claimed in claim 1, wherein the via has a non-circular outline.

13. The display panel as claimed in claim 1, wherein the via has an ellipse-like outline observing from a direction from the data line to the first substrate, the ellipse-like outline has a long axis and a short axis, and an included angle between the long axis and an extension direction of the data line is in a range from 0° to 10°.

14. The display panel as claimed in claim 13, wherein the long axis is parallel to the extension direction of the data line.

15. A display device, comprising:
   a display panel, comprising:
   a first substrate;
   a scan line disposed on the first substrate;
   a data line disposed on the first substrate and overlapping with the scan line to form a first overlapping region; and
   an active layer disposed between the scan line and the data line and overlapping with the scan line and the data line to form a second overlapping region, wherein the second overlapping region locates in the first overlapping region and has a via for electrically connecting the data line and the active layer,
   wherein an edge of the scan line has a first length along an extension direction of the scan line in the first overlapping region, the active layer has a second length along the extension direction of the scan line in the second overlapping region, and the second length is greater than the first length,
   wherein the first overlapping region comprises a first edge and a first concave, the first edge is the edge of the scan line in the first overlapping region, and an end of the first concave connects to an end of the first edge, and at least one part of the first concave is curved shape.

* * * * *